(12) United States Patent
Cusey et al.

(10) Patent No.: US 11,378,422 B2
(45) Date of Patent: Jul. 5, 2022

(54) METHOD AND APPARATUS FOR IMPROVED PERFORMANCE IN ENCODER SYSTEMS BY CONFIGURING A DETECTOR ARRAY USING A PARTITION MAP AND ASSIGNING WEIGHTS TO OUTPUT CURRENTS OF THE DETECTOR ARRAY

(71) Applicant: TT Electronics PLC, Carrollton, TX (US)

(72) Inventors: James P. Cusey, Dallas, TX (US); Brent Hans Larson, Dallas, TX (US)

(73) Assignee: TT ELECTRONICS PLC, Carrollton, TX (US)

( * ) Notice: Subject to any disclaimer, the term of this patent is extended or adjusted under 35 U.S.C. 154(b) by 111 days.

(21) Appl. No.: 16/660,987

(22) Filed: Oct. 23, 2019

(65) Prior Publication Data

US 2020/0141766 A1    May 7, 2020

Related U.S. Application Data

(60) Provisional application No. 62/755,658, filed on Nov. 5, 2018.

(51) Int. Cl.
*G01D 5/347* (2006.01)
*H03M 1/26* (2006.01)
(Continued)

(52) U.S. Cl.
CPC ........... *G01D 5/3473* (2013.01); *G01D 5/12* (2013.01); *G01D 5/34715* (2013.01);
(Continued)

(58) Field of Classification Search
CPC .......... G01D 5/3473; G01D 5/34715; G01D 5/34792; G01D 5/12; G01D 5/38;
(Continued)

(56) References Cited

U.S. PATENT DOCUMENTS 4,465,928 A    8/1984    Breslow
6,054,938 A    4/2000    Nakajima et al.
(Continued)

FOREIGN PATENT DOCUMENTS

EP    0276402 A1    8/1988
EP    1308700       7/2003
(Continued)

OTHER PUBLICATIONS

PCT International Searching Authority—US, PCT Notification of Transmittal of the International Search Report and the Written Opinion of the International Searching Authority, or the Declaration, dated Mar. 19, 2020 for International Application No. PCT/US2019/057879, 10 pages, Alexandria, VA.
(Continued)

*Primary Examiner* — Jennifer D Bennett
(74) *Attorney, Agent, or Firm* — Haynes and Boone, LLP

(57) ABSTRACT

An encoder system includes a configurable detector array, wherein the configurable detector array includes a plurality of detectors. The encoder system may also include a memory operable to store a partition map that defines a state for each of the plurality of detectors. The encoder system may also include an emitter operable to generate a flux modulated by a motion object, wherein the configurable detector array is operable to receive the flux and generate respective current outputs for each of the detectors in response to the flux. In an embodiment, the current outputs from detectors having a same state are grouped together. The encoder system may also include one or more current duplicators to duplicate the current outputs from detectors having one state to group with the current outputs from detectors having a different state. The encoder system may also adjust weights of the current outputs.

11 Claims, 17 Drawing Sheets

(51) Int. Cl.
*G01D 5/12* (2006.01)
*H03M 1/30* (2006.01)
*G01D 5/244* (2006.01)

(52) U.S. Cl.
CPC ............. *H03M 1/26* (2013.01); *H03M 1/303* (2013.01); *G01D 5/24409* (2013.01); *G01D 5/34792* (2013.01)

(58) Field of Classification Search
CPC ............... G01D 5/347; G01D 5/24404; G01D 5/24409; H01L 31/16; H01L 27/14; H01L 27/1446; H01L 31/164; H03M 1/285; H03M 1/303; H03M 1/206; H03M 1/26
See application file for complete search history.

(56) References Cited

U.S. PATENT DOCUMENTS

| | | | |
|---|---|---|---|
| 6,501,905 | B1 | 12/2002 | Kimura |
| 6,727,493 | B2 | 4/2004 | Franklin et al. |
| 6,928,386 | B2 | 8/2005 | Hasser |
| 7,199,354 | B2 | 4/2007 | Mayer et al. |
| 7,381,942 | B2 | 6/2008 | Chin et al. |
| 7,619,210 | B2 | 11/2009 | Wong et al. |
| 8,169,619 | B2 | 5/2012 | Oberhauser |
| 8,674,287 | B2 | 3/2014 | Yoshida et al. |
| 8,729,458 | B2 | 5/2014 | Kato |
| 2003/0085345 | A1* | 5/2003 | Franklin ............... G01D 5/34 250/231.13 |
| 2007/0003225 | A1* | 1/2007 | Moteki ............... G11B 27/329 386/334 |
| 2008/0251701 | A1* | 10/2008 | Wong ............... G01D 5/34707 250/231.18 |
| 2012/0085897 | A1 | 4/2012 | Kato |
| 2012/0104236 | A1* | 5/2012 | Thor ............... G01D 5/347 250/208.6 |
| 2012/0155532 | A1 | 6/2012 | Puri et al. |
| 2016/0020168 | A1 | 1/2016 | Kao et al. |
| 2016/0093273 | A1 | 3/2016 | Wang et al. |
| 2018/0266852 | A1 | 9/2018 | Cusey et al. |

FOREIGN PATENT DOCUMENTS

| | | |
|---|---|---|
| JP | 63205518 A | 8/1988 |
| TW | 201534871 | 9/2015 |
| TW | I591319 | 7/2017 |
| TW | 201835532 A | 10/2018 |
| WO | 9321499 A1 | 10/1993 |

OTHER PUBLICATIONS

Office Action and Search Report dated Jun. 29, 2020 for Taiwanese Patent Application No. TW108139463. 9 pages.

PCT, Notification of Transmittal of the International Search Report and the Written Opinion of the International Searching Authority, or the Declaration, Application No. PCT/US2017/060705, dated Feb. 12, 2018, 15 pages.

Office Action and Search Report (including translations) dated Sep. 5, 2019, TW Application No. 108104828, 7 pages.

* cited by examiner

METHOD AND APPARATUS FOR IMPROVED PERFORMANCE IN ENCODER SYSTEMS BY CONFIGURING A DETECTOR ARRAY USING A PARTITION MAP AND ASSIGNING WEIGHTS TO OUTPUT CURRENTS OF THE DETECTOR ARRAY

CROSS REFERENCE TO RELATED APPLICATIONS

The present application claims the benefit of U.S. Provisional Patent Application No. 62/755,658, filed Nov. 5, 2018, entitled "Method and Apparatus for Improved Performance in Encoder Systems", the disclosure of which is incorporated by reference herein in its entirety.

BACKGROUND

An encoder system, such as an optical encoder, may include an electro-mechanical device that detects and converts positions (e.g., linear and/or angular positions) of an object to analog or digital output signals by using one or more photodetectors. There are different types of encoders, such as rotary encoders and linear encoders. An exemplary encoder system usually uses a light source, a light modulator located in the source light pathway, and an encoder chip (e.g., an optical sensor integrated circuit) including one or more photodetectors that receive the modulated light and generate electrical signals in response thereto. In some embodiments, the encoder chip includes a configurable photodetector array, which provides convenience and flexibility to match one encoder chip to multiple encoder modules regardless of type and specific mechanical construction, such as code wheel or code strip configurations. In the configurable photodetector array, each photodetector (termed "pixel") is assigned a state, such as one of the quadrature states corresponding to a respective quadrature track. However, some pixels may have contributions in more than one quadrature track but are forced to be assigned to a single quadrature state, which causes inaccuracy in the encoder system. Furthermore, treating current outputs from a pixel in response to an incident light with same weight may also cause inaccuracy when the light source generates a non-uniform light intensity profile. For a high-resolution encoder system, there is a need to find ways to better assign states and weights to the pixels.

Accordingly, to improve accuracy of an encoder system, improvements in the encoder chip are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
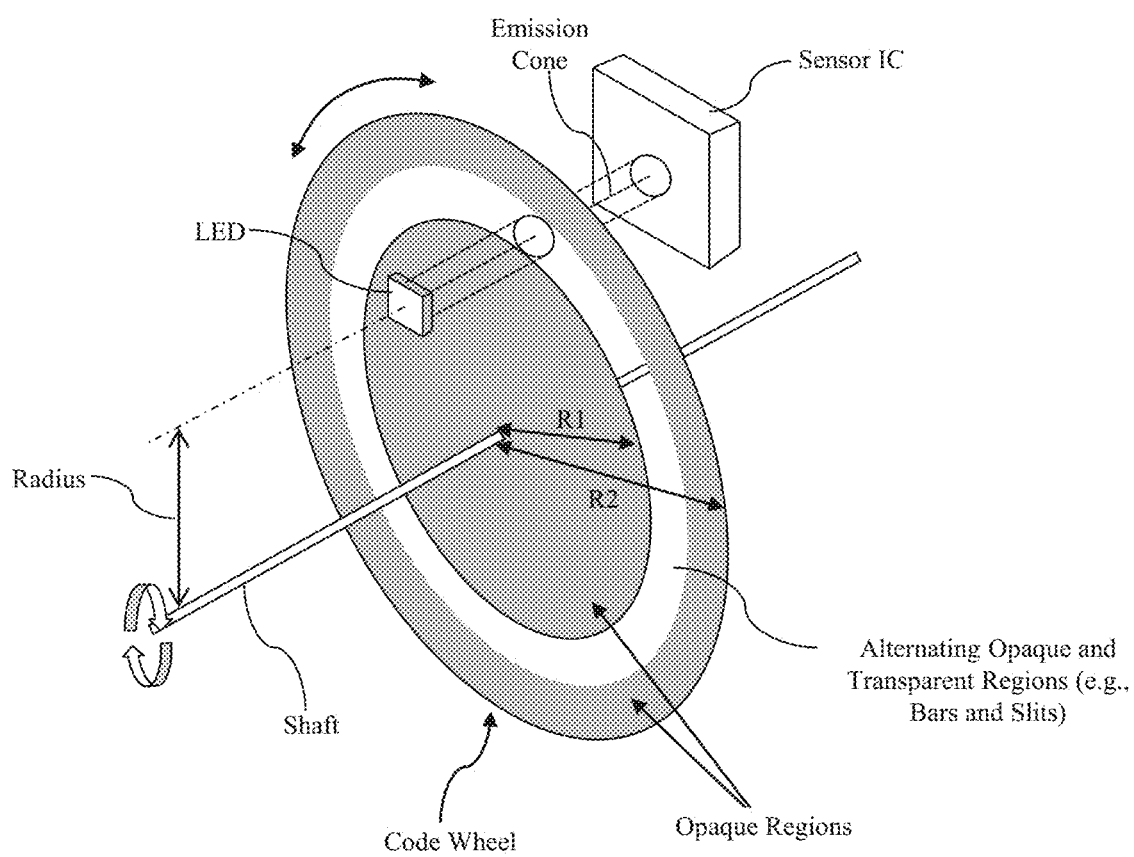
FIG. 1 is an illustration of an exemplary transmissive optical encoder, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. Any alterations and further modifications to the described devices, systems, methods, and any further application of the principles of the present disclosure are fully contemplated as would normally occur to one having ordinary skill in the art to which the disclosure relates. For example, the features, components, and/or steps described with respect to one embodiment may be combined with the features, components, and/or steps described with respect to other embodiments of the present disclosure to form yet another embodiment of a device, system, or method according to the present disclosure even though such a combination is not explicitly shown. Further, for the sake of simplicity, in some instances the same reference numerals are used throughout the drawings to refer to the same or like parts.

The present disclosure is generally related to encoder systems and methods thereof, more particularly to an optical encoder with a configurable photodetector array and methods for detecting and converting position information of a target object to analog or digital output signals. For the purposes of simplicity, the embodiments described herein will use a code wheel (for rotary encoders) as an example of the target object, although the scope of embodiments may include any suitable optical detection of moving objects. For example, the principles in the present disclosure can also be used for alignment adjustment for encoders targeted in detecting linear movements (e.g., a code strip for linear encoders). Various embodiments of the present disclosure enable the use of a configurable photodetector array, which allows a single integrated circuit (IC) design for encoder modules of varying configurations without degradation of output signal quality, thus enabling the lower cost arising from higher volume and a simpler supply chain resulting from managing fewer IC part numbers. Further, various embodiments of the present disclosure enable a technique to more accurately map outputs (i.e., currents or voltages) from a configurable photodetector array to different regions and to weight the optical energy contribution, which refines a mapping from the configurable photodetector array to a code wheel or a code strip and increases accuracy of an overall encoder system.

A non-uniform light intensity profile of a light source may also be compensated by the illustrated technique. For the purposes of simplicity, the embodiments described herein will focus on current domain, such as current duplicators and current weight adjustors that will be discussed in further details below. However, the same principle can also be applied to voltage domain, such as converting a current to a voltage by a transimpedance amplifier (TIA) then duplicating or adjusting the voltage.

Additionally, other embodiments, for example, a magnetic encoder system may have a configurable magnetic-field detector array to detect magnetic flux changes due to modulation from a moving object, such as a code wheel or a code stripe. However, for ease of illustration, the embodiments described herein focus on optical detection, and it is understood that such principles may be applied to magnetic detection systems.

Optical encoders may include incremental and absolute encoders that are used to track motion and can be used to determine position and velocity. This can be either linear or rotary motion. Because the direction can be determined, very accurate measurements can be made. Regardless of type and specific mechanical construction, optical encoders generally use the same optical detection mechanism and components: a light source, a light modulator located in the source light pathway, and light detectors that receive the modulated light and generate electrical signals in response thereto. The light source may include, for example, a light-emitting diode (LED), and may emit electromagnetic radiation within the infrared to ultraviolet spectral region. In some embodiments, the light source may include a laser emitter.

The light modulator is commonly in the form of a thin disk, such as a code wheel, concentric with the rotating shaft and having its faces perpendicular to the source light pathway. The code wheel may have a pattern of transparent and opaque areas formed on the faces so that as the shaft rotates, the source light passing through the wheel faces is interrupted in accordance with the pattern. The unique light pattern illuminated by the wheel is sensed by the light detectors. In response, the light detectors generate electrical signals that interchange between a high current level (or a high voltage level) and a low current level (or a low voltage level) and that can be graphically represented as continuous time-varying waves. FIG. 1 depicts an embodiment of a transmissive rotary optical encoder. Within FIG. 1, the region of a code wheel labeled "alternating opaque and transparent regions" consists of one or more tracks. In this example, a track is the set of points on the code wheel whose distance from the center of the shaft is between an inner radius R1 and an outer radius R2, and the opaque (e.g., bars) and transparent (e.g., slits) regions of the track are arranged such that the track has discrete rotational symmetry of order N about the shaft center, where N≥1. One such track on an incremental encoder is known as the quadrature track, whose order of rotational symmetry is termed the pulses per revolution (PPR) of the encoder system. The transmissive optical encoder in the illustrated embodiment is merely an example, and is not intended to limit the present disclosure beyond what is explicitly recited in the claims. The principle of the present disclosure may also be applicable to a reflective optical encoder.

Figure 2:
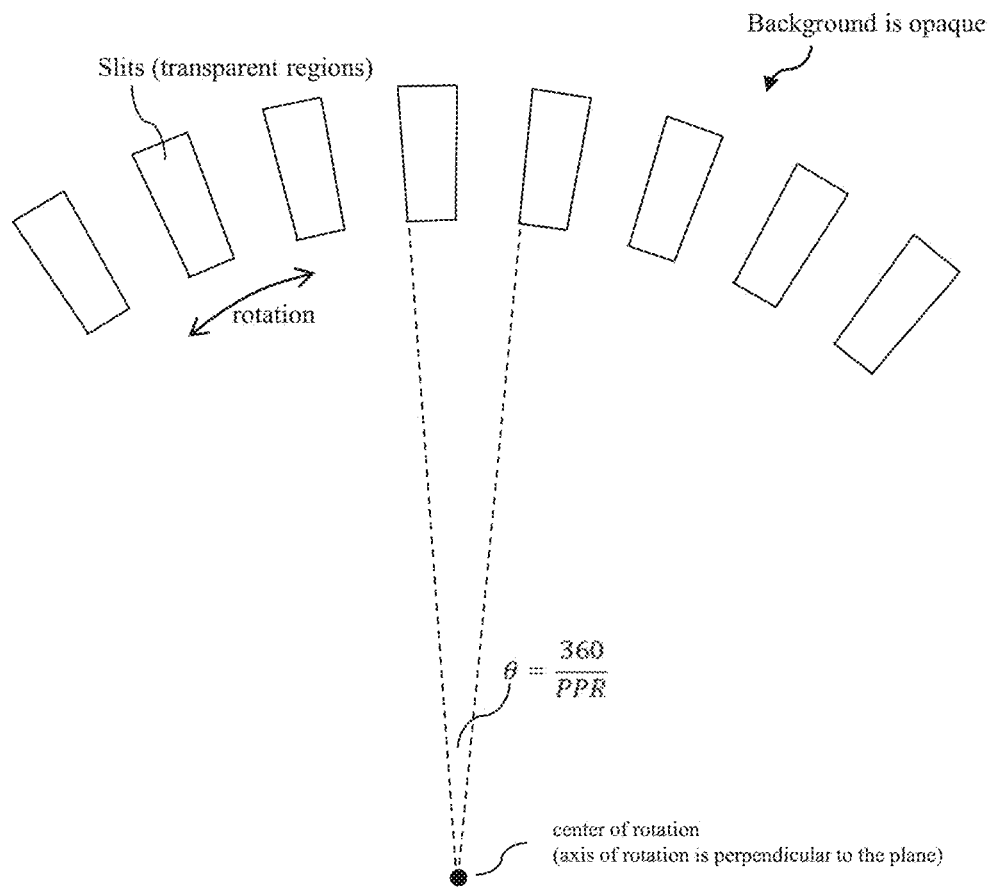
FIG. 2 is an illustration of an exemplary pattern of quadrature-track code wheel slits in a transmissive optical encoder system, in accordance with some embodiments.

FIG. 2 depicts an example embodiment of a quadrature track. The optical sensor integrated circuit (IC) in FIG. 1 contains a plurality of photoactive areas, grouped into regions, such as A+, A−, B+, and B− regions, and aligned to the quadrature track of the code wheel (i.e. at a distance from the axis of code wheel rotation between R1 and R2 of the quadrature track). Each of the A+, A−, B+, and B− regions is composed of one or more discrete photoactive areas connected in parallel (so that the photocurrents of the parallel discrete photoactive areas are additive), as described in more detail below. A light emitter (e.g., an LED) illuminates lights towards the photoactive areas. The light would be blocked by the opaque regions of the track or pass through the transparent regions and arrive at the photoactive areas.

Figure 3:
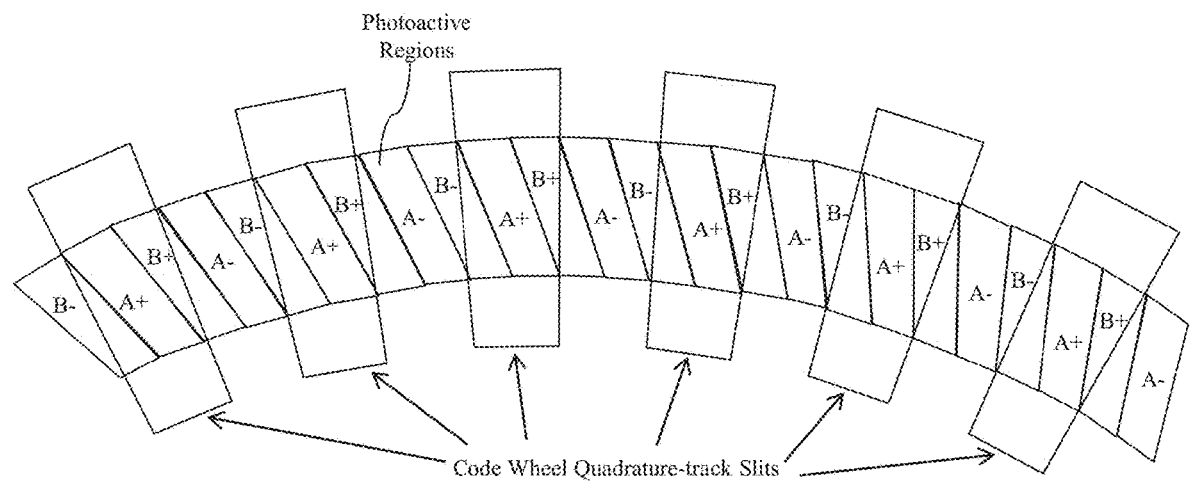
FIG. 3 shows an exemplary embodiment of quadrature assignments (A+, A−, B+, B−) to a photoactive region on an optical sensor IC, superimposed upon a code wheel's quadrature track shown in FIG. 2, in accordance with some embodiments.
Figure 4:
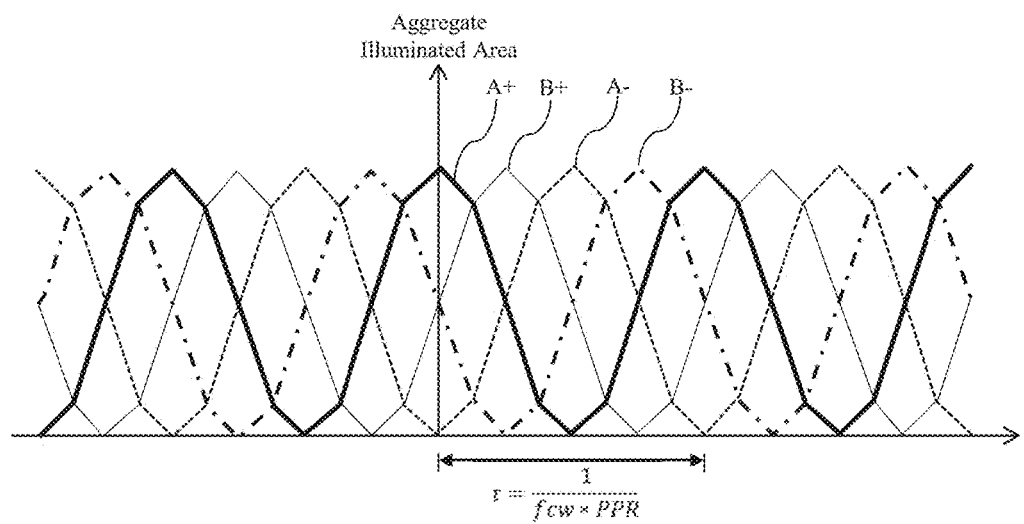
FIG. 4 shows aggregated illuminated areas of A+, A−, B+, B− regions in FIG. 3 when a code wheel is rotated clockwise at a constant rate, in accordance with some embodiments.

FIG. 3 depicts an exemplary embodiment of the A+, A−, B+, and B− regions of the optical sensor IC in an encoder system with part of the code wheel quadrature track superimposed. FIG. 4 depicts the aggregate photocurrents of the A+, A−, B+, and B− regions as depicted in FIG. 3 over a span of time assuming a constant code wheel rotation rate (herein aggregate photocurrent is assumed to be directly proportional to aggregate illuminated area). As can be seen in FIG. 4, the photocurrent waveforms are periodic with period $1/(f_{CW}*PPR)$, where $f_{CW}$ is the rotational frequency of the code wheel and PPR is the order of rotational symmetry of the quadrature track of the code wheel. Moreover, the photocurrent waveforms are approximately sinusoidal and are in quadrature (i.e. equal in magnitude and separated in phase by 90°). The scheme depicted in FIG. 3, where the photoactive areas on the sensor IC alternate spatially between the A+, B+, A−, and B− regions and are closely matched in size and position to the geometries of the slits and bars in the quadrature track of the code wheel, is known as a phased-array design. Because the geometry of the code wheel quadrature-track slits and bars changes if the code wheel configuration (radius and PPR) changes, a phased-array design intended for use with a particular code wheel configuration may not operate properly when used with a different code wheel configuration. Furthermore, different code wheels may have different slit shapes. In the illustrated embodiment, the slit shape is regular, such as a pie-shaped with a radius at each end, and different slits may have an identical slit shape. In various other embodiments, a slit shape may be irregular, while different slits on a same code wheel may further have different shapes. Therefore, manufacturers of incremental encoders traditionally require a different IC design for each different code wheel configuration they deploy. For manufacturers that make many different encoder modules in low-to-moderate volume with configurations, this necessitates the purchase of many different ICs in low-to-moderate volume. This results in a higher cost and more complex supply chain than would be needed if the same IC may be used for multiple encoder modules regardless of configuration.

For example, if a customer normally supports 3 code wheel radii and 4 different PPR per radii, then the customer would have to maintain an inventory of 12 different ASICs (at least in theory). It is therefore desired to enable the use of a single IC design for encoder modules of varying configurations without significant degradation of output signal quality, thus allowing the lower cost arising from higher volume and a simpler supply chain resulting from managing fewer IC part numbers. Using a configurable photodetector array would allow the customer to inventory a single IC for a multitude of code wheel radii and PPR, generally allowing a lower cost position for the customer due to higher volumes and reduced material handling.

Figure 5:
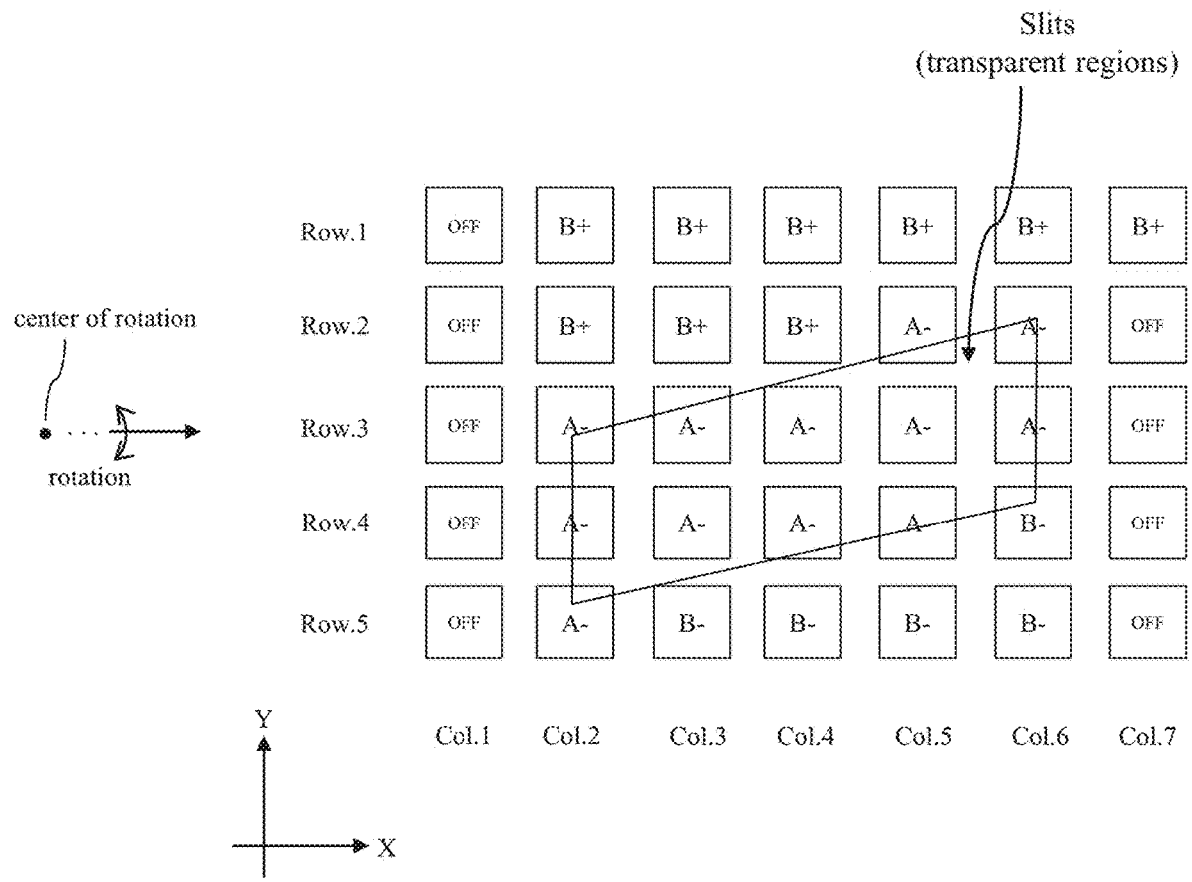
FIG. 5 illustrates an exemplary configurable photodetector array and configured quadrature assignments to pixels in the array, superimposed upon a code wheel's quadrature track, in accordance with some embodiments.

FIG. 5 illustrates a configurable photodetector array in an optical sensor IC and an example of configured quadrature assignments to each photodetector in the array, superimposed upon a code wheel's quadrature track. The configurable photodetector array forms a photoactive area of the optical sensor IC. Each photodetector may include either a photodiode or a phototransistor. For simplicity, a photodetector in the array is also referred to as a pixel, and the configurable photodetector array is also referred to as a pixel array. In the illustrated example, the pixel array contains 5 rows by 7 columns of pixels, a total of 35 pixels. In the illustrated example, a row is defined as extending along a direction parallel to a polar axis of a code wheel, and a column is defined as extending along a direction perpendicular to a polar axis of a code wheel. The pixels and the pixel array in the illustrated embodiment are merely an example and is not intended to limit the present disclosure beyond what is explicitly recited in the claims. The principle of the present disclosure may also be applicable to a pixel array containing any number of rows and any number of columns. Further, the illustrated pixel array in FIG. 5 may represent a region of a larger array, such as a small portion in a larger pixel array containing 64 rows by 32 columns of pixels (a total of 2048 pixels). Also, a pixel array may have a shape other than a rectangular shape, such as a square shape, or other suitable shapes.

FIG. 5 shows an illustration of how track slits can overlap with pixels. Pixels are programmatically selected to route their currents to a particular region (i.e., A+, A−, B+, B− regions for a quadrature track or Y, U, V, Z, ABS regions for various other tracks such as a commutation track, index track, or an absolute track). This particular region is also termed an assignment or a state of the pixel. Assigning states can be performed when the optical sensor IC is powered up by reading from a pixel partition map stored in a memory module, such as a non-volatile memory. The configuration may also be updated on-the-fly. The pixel partition map stores states to each pixel in the pixel array. In the illustrated example in FIG. 5, the pixels on rows 1-2 of column 2 are set to B+ and the pixels on rows 3-5 of column 2 are set to A−, while pixels of column 1 are all set to OFF.

The pixel partition map tries to fit the states to a particular track configuration. Generally, pixels configured with the same quadrature assignments form photoactive regions in proximity to a shape of the slit. In the illustrated example in FIG. 5, the pixels with A− assignments form a photoactive region matched to the respective slit. In some embodiments, pixels configured with the same quadrature assignments form photoactive regions in strip shapes. In some other embodiments, the pixels configured with the same quadrature assignments form photoactive regions in mosaic shapes. The assignment of the pixels is typically a function of the code wheel's radius and PPR, and a pixel array's shape, pixel numbers, and spacing. In some embodiments, the consideration of pixel assignment also includes installation misalignments between the optical sensor IC and the code wheel. In furtherance of some embodiments, the consideration of pixel assignments includes correcting unbalanced currents or gains and phase errors such as due to installation misalignments.

When the optical sensor IC is installed with a different track, individual ones of these pixels may change states to form a new pixel pattern that fits the new code wheel. Or, during an optical encoder operation, the system may determine to incrementally change the pixel partition map on-the-fly, and these particular pixels may be changed, such as from A− to A+, B+, or B−, together with some other pixels in the pixel array. Therefore, a pixel array provides an advantage to enable the use of a single IC design for various code wheels. As a comparison, most existing optical encoder designs use a fixed pattern phased array for detectors, such pattern exactly matches a particular code wheel, thus limiting the array to a code wheel of specific size and PPR (pulse per revolution). This is because the geometry of the code wheel quadrature-track slits and bars changes if the code wheel configuration (radius and PPR) changes, and consequently a phased-array design intended for use with a particular code wheel configuration may not operate properly when used with a different code wheel configuration. For manufacturers that make many different encoder modules in low-to-moderate volume with configurations, this may necessitate the purchase of many different ICs in low-to-moderate volume. This results in a higher cost and more complex supply chain than would be needed if the same IC may be used for multiple encoder modules regardless of configuration. Using optical sensor IC with a pixel array allows the user to inventory a single IC for a multitude of code wheel radii and PPR, generally allowing a lower cost position for the user due to higher volumes and reduced material handling.

The shape of pixels may be made non-homogeneous within the pixel array. Having different size/shape pixels may reduce total system noise. The rectangular, grid-based pixels may produce a small amount of noise compared with an ideally shaped detector that better matches the slit. Adjusting the shape to round, elliptical, or rounded corners may reduce overall noise. Further, changing the size of individual or groups of pixels may also improve system noise at the expected cost of increased layout complexity and increased modeling requirements to determine pixel mapping.

Figure 6:
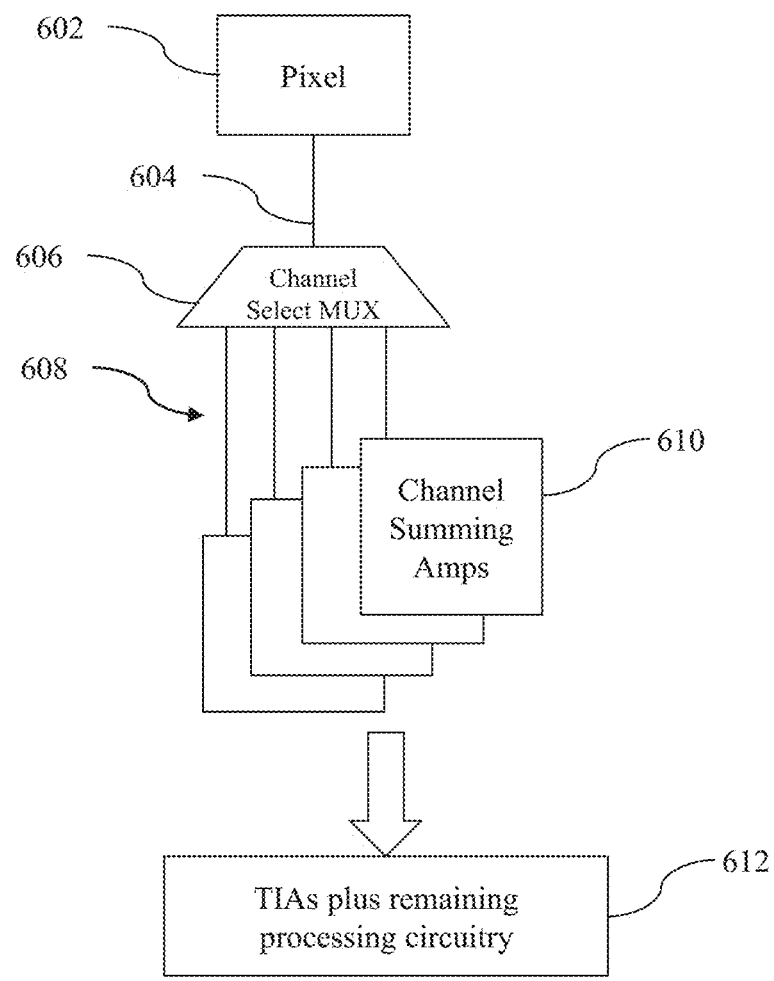
FIG. 6 shows an exemplary schematic of quadrature assignment mechanism to a pixel in a configurable photodetector array, in accordance with some embodiments.
Figure 7:
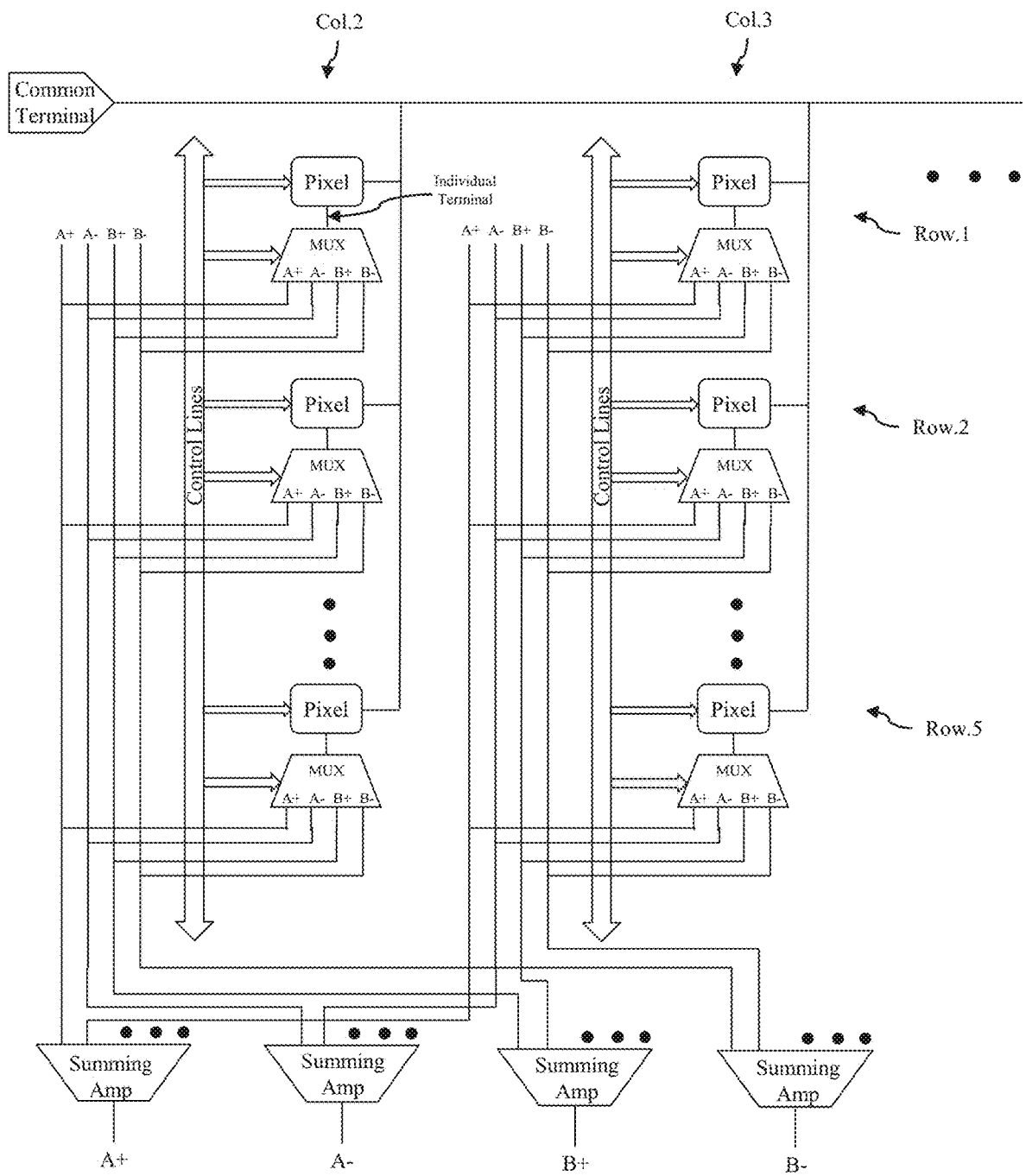
FIG. 7 shows an exemplary circuit diagram of a configurable photodetector array according to the schematic illustrated in FIG. 6, in accordance with some embodiments.

Pixels with the same assigned state are selected to route their currents together. A pixel array may include a plurality of pixels and a plurality of lumped current-mode outputs. Referring to FIG. 6, a current output 604 from a single pixel 602 is coupled to a switch 606, such as a channel select multiplexer (MUX). The MUX 606 routes the current output to one of the lumped current-mode outputs 608 (e.g., collected by a channel summing amplifier 610). The summed currents are further routed to transimpedance amplifiers (TIAs) and other processing circuitry 612. FIG. 7 illustrates an exemplary circuit diagram of the pixel array in FIG. 5, in accordance with the schematic in FIG. 6. For simplicity, only pixels at rows 1, 2 and 5 of columns 2 and 3 are shown.

Referring to FIG. 7, each pixel includes a photoactive area with at least two electrical terminals, in which current flows between the first terminal (connected to all pixels in the array, also as common or ground terminal) and the second terminal (unique to each pixel, also as individual terminal) in proportion to the optical power incident to the photoactive area. Each pixel may have its own MUX. The second terminal is coupled to this MUX. The MUX receives configuration bits from control lines (e.g., a bus line, or an SRAM word line) and routes the individual terminal of the photoactive area to one of the lumped current-mode outputs, no more than one of which is routed to the individual terminal at any given time. In this way, each lumped current-mode output carries current equal to the sum of the photocurrents in the photoactive areas of those pixels whose switches to that output are closed. Each one of the lumped current-mode outputs corresponds to a respective quadrature track assignment (e.g., A+, A−, B+, B−). The control line may use 2 bits to select one of the four lump quadrature track assignments of a MUX. The currents with the same quadrature track assignment are further grouped by a channel summing amplifier.

The pixels in a pixel array may be partitioned among the various lumped current-mode outputs based upon the configuration of the code wheel. Partitioning may be performed by writing to the memory bits to control the MUX. The pattern for the pixels is based on the design of the code wheel in the system. In an exemplary embodiment, a process of simulation or experimentation is used to determine the mapping for the pixels based on the code wheel radii and the slit pattern. The result is an initial partition map written into the memory of an ASIC to set each pixel to the correct region. In some embodiments, the initial partition map is still subject to a partition map adjustment during a current distribution and weight adjustment process before the encoder system is ready for regular operations.

In some embodiments, pixels can be set to an OFF state. An example solution sets each pixel to one of the 4 primary regions: A+, B+, A−, B−. It may be advantageous in some cases to turn individual pixels off. For example, the control line may further use a control bit to control turning ON or OFF of a pixel. This may be performed pixel-by-pixel or based on entire rows or columns. Another implementation to shut a pixel off is to add one more control bit to the MUX to select a status that none of the four lump current mode outputs are coupled to the individual terminal. By allowing a pixel to be turned OFF, this may allow the pixels to potentially more closely match the code wheel pattern. Further, this capability may allow better current balancing across the 4 main regions, simplifying the design of the downstream blocks in the ASIC like the transimpedance amplifiers (TIAs), filters, and comparators.

The lumped current outputs in this example are routed to transimpedance amplifiers (TIAs), such as four single ended TIAs or two differential TIAs. This is shown in more detail with respect to FIG. 8. These amplifiers convert the current output from the pixel array into voltage signals that can be used for downstream processing. These TIAs are sized appropriately for the current outputs from the 4 blocks. In an embodiment, The TIAs may be highly linear in order to produce high-quality analog outputs for the quadrature tracks. In another embodiment, the TIAs are logarithmic, in order to accommodate a wide dynamic range of input (e.g., when analog quadrature-track outputs aren't needed). The transimpedance should be large enough to keep the angular position error introduced by the amplifier's own internal noise and offset of downstream comparators small, yet small enough to preserve good linearity at full-scale input current. Each TIAs' instance may have an adjustable current sink additive to its input, for offset compensation. The current sink value for a particular instance may be controlled by a control byte corresponding to that instance. The adjustable current sink may include latches in which to store the control bit(s) (e.g., a byte).

Figure 8:
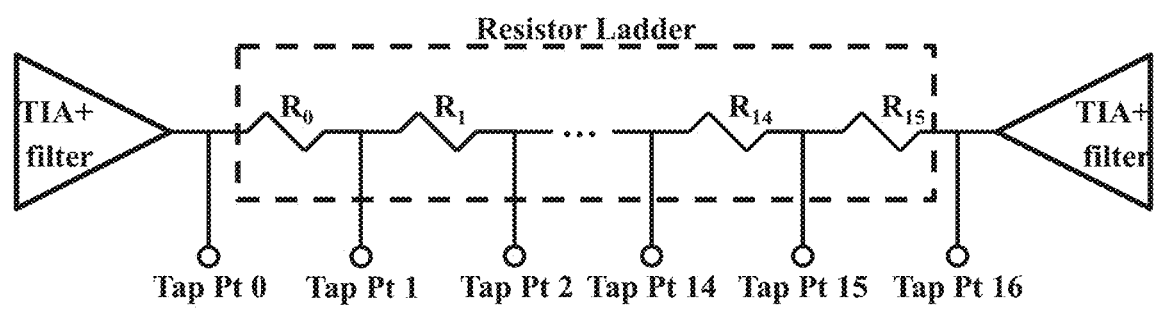
FIG. 8 shows an exemplary circuit diagram of an example interpolator resistor ladder architecture that converts configurable photodetector array's readings into analog output with transimpedance amplifiers (TIAs), in accordance with an embodiment.

FIG. 8 shows a circuit diagram of an exemplary interpolator resistor ladder architecture that converts photodetector array readings into analog output with transimpedance amplifiers (TIAs). This is merely an example. Other suitable implementations, such as other suitable number of interpolator resistors (≥2) and/or other suitable circuit topology, may also be used. In the illustrated embodiment, this block generates analog waveforms that are phase-shifted from the filtered A+/A−/B+/B− TIA output waveforms by between 0° and 90° in equal steps of 5.625° (=90°/16). By digitally comparing appropriate interpolated waveforms, square waves of up to 16× the frequency of the TIA outputs can be generated in this example. The block consists of four identical resistor ladders, each between the filtered outputs of two of the four quadrature-track TIAs (A+, A−, B+, B−): one between the B+ and A− filtered TIA outputs, one between the A− and B− filtered TIA outputs, one between the B− and A+ filtered TIA outputs, and the fourth between the A+ and B+ filtered TIA outputs. Various other embodiments may be scaled as appropriate to provide any number of steps.

Figure 9:
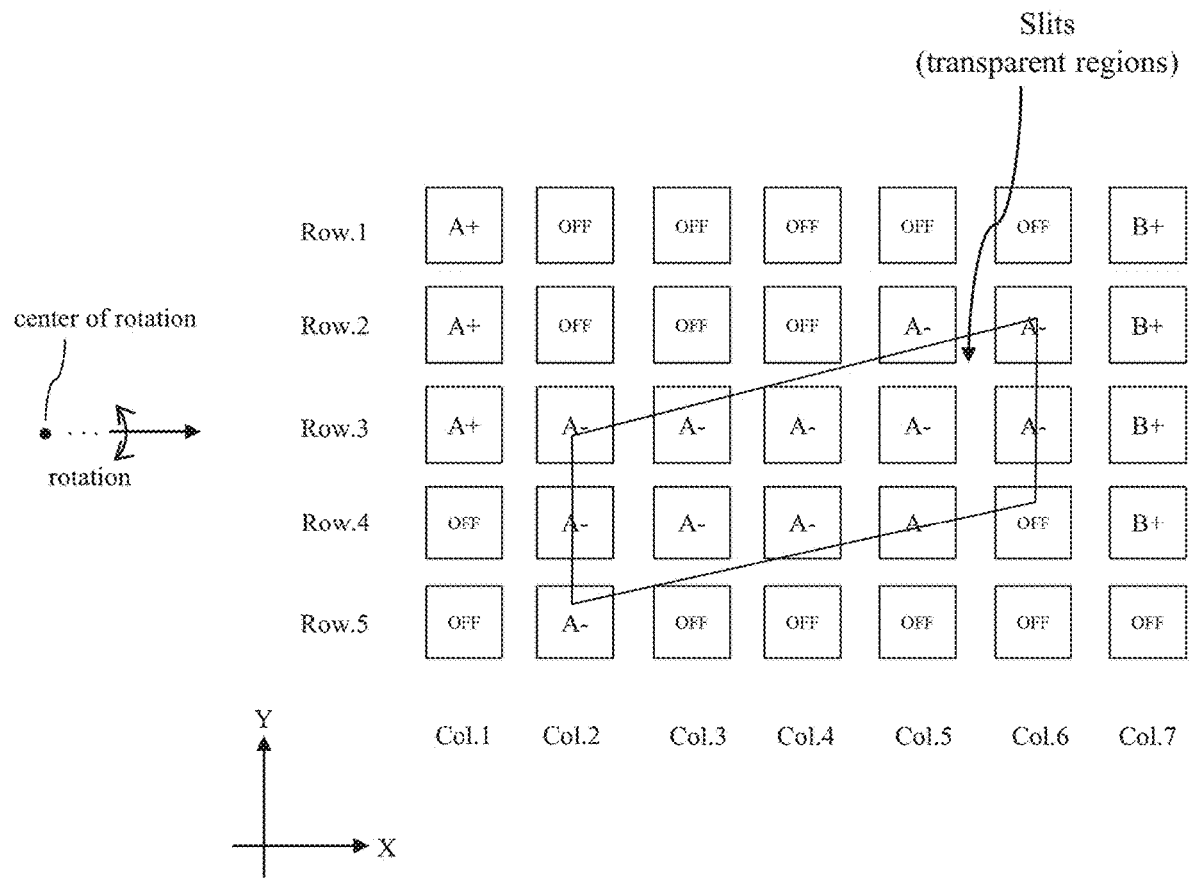
FIG. 9 illustrates another exemplary configurable photodetector array and configured quadrature assignments to columns in the array, superimposed upon a code wheel's quadrature track, in accordance with some embodiments.

FIG. 9 illustrates a pixel array which is similar to what has been discussed above with reference to the pixel array in FIG. 5. For example, the pixel array in FIG. 9 also has 5 rows by 7 columns of pixels. Different from the one in FIG. 5, the pixel array in FIG. 9 receives different pixel assignments. Specifically, in FIG. 5 pixels in the same column may be assigned to more than one quadrature states, such as B+ and A− quadrature states for pixels in column 2. In FIG. 9 pixels in the same column are assigned a single quadrature state and an optional OFF state, such as A− quadrature state and OFF state for pixels in column 2. By assigning each column with a single quadrature state, current outputs from pixels in the same column may be summed together and contribute to the same state. Consequently, only one MUX is used for one column of the pixel array in such an embodiment, which greatly simplifies circuit complexity relative to other embodiments using more MUXs.

Figure 10:
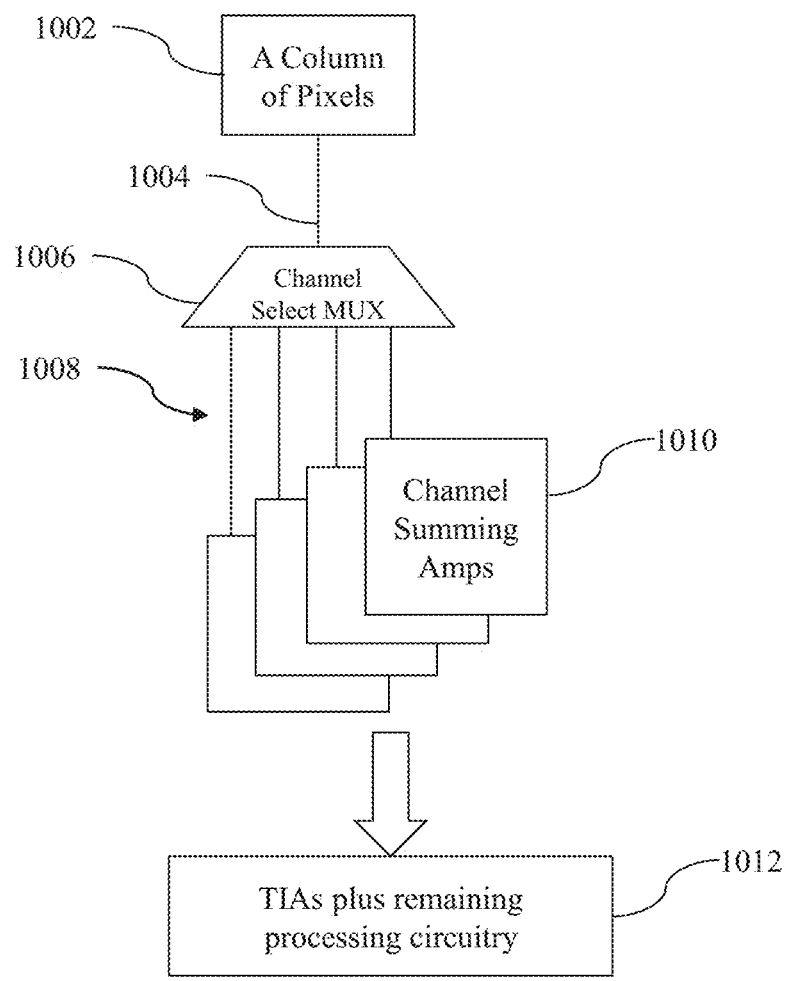
FIG. 10 shows another exemplary schematic of quadrature assignment mechanism to a column in a configurable photodetector array, in accordance with some embodiments.

Referring to FIG. 10, current outputs 1004 from a column of pixels 1002 are grouped together and received by one MUX 1006. The MUX 1006 routes the current output to one of the lumped current-mode outputs 1008 (e.g., collected by a channel summing amplifier 1010). The lumped current outputs are further routed to transimpedance amplifiers (TIAs) and other processing circuitry 1012.

Figure 11:
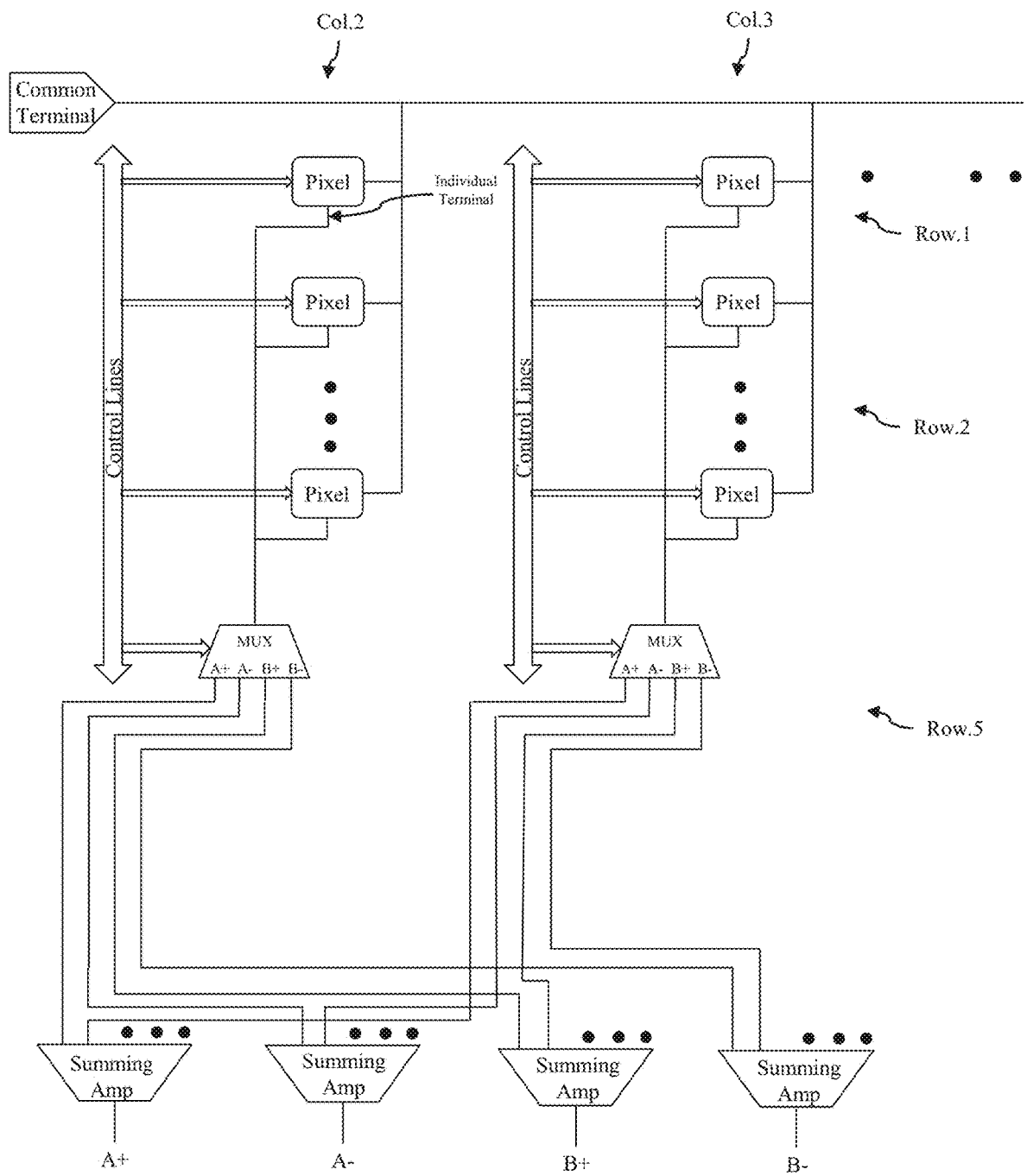
FIG. 11 shows another exemplary circuit diagram of a configurable photodetector array according to the schematic illustrated in FIG. 9, in accordance with some embodiments.

FIG. 11 illustrates an exemplary circuit diagram of the pixel array in FIG. 9, in accordance with the schematic in FIG. 10. For simplicity, only pixels at rows 1, 2 and 5 of columns 2 and 3 are shown. In FIG. 11, each pixel includes a photoactive area with at least two electrical terminals, in which current flows between the first terminal (connected to all pixels in the array, also as common or ground terminal) and the second terminal (unique to each pixel, also as individual terminal) in proportion to the optical power incident to the photoactive area. Instead of one MUX for each respective pixel (e.g., in FIG. 7), there is one MUX for a respective column of pixels. This is because the pixels in the same column all have the same quadrature state and the respective current outputs can be summed together and collectively feed to one MUX. In the illustrated example, summing current outputs can be achieved by physically shorting the second terminals of the pixels in the same column (as shown in FIG. 11) or by using a current summing amplifier (not shown) before the MUX to collect the current outputs. The MUX receives configuration bits from control lines (e.g., a bus line, or an SRAM word line) and routes the summed current outputs from one column to one of the lumped current-mode outputs. Each one of the lumped current-mode outputs corresponds to a respective quadrature track assignment (e.g., A+, A−, B+, B−). The control line may use 2 bits to select one of the four lump quadrature track assignments of a MUX. The currents from other columns with the same quadrature track assignment are further grouped by a channel summing amplifier.

Individual pixels in the same column can be set to an OFF state to represent the optimal mapping. For example, as shown in FIG. 9, pixels in rows 1 and 2 of column 2 are set to an OFF state to form photoactive regions to approximate a shape of the slit. Setting the OFF state may be performed pixel-by-pixel or based on entire rows or columns. For example, the control line may further use a control bit to control turning on or off of a pixel. Another implementation to shut a pixel off is to add one more control bit to the MUX to select a status that none of the four lump current-mode outputs are coupled to the individual terminal.

In an example practical system, pixel pattern mapping is not perfect and some pixels have contributions in more than one quadrature track but are forced to be assigned to a single track. Referring back to FIG. 5, the sketch shows a static orientation. In a real system, the code disk would rotate one slot position for a full cycle. As can be observed from the overlapping sketch, not all pixels will map perfectly into only one region. Pixels at an edge of the slit may have contributions to more than one state. For example, the pixel at row 3 of column 2 is assigned with A−. However, more than half of the photoactive area of this pixel is not covered by the slit. Since a neighboring pixel at row 2 of column 2 is assigned with B+, it is possible the pixel at row 3 of column 2 contributes to both A− and B+. But the current output from this pixel is fully grouped into state A−. Another example is the pixel at row 4 of column 6 assigned with B−. However, the upper left corner of the photoactive area of this pixel is covered by the slit, so that the portion of the current output with respect to this corner could be thought of as contributing to state A−. Similarly, besides individual pixels, a column of the pixel array may have contributions to more than one state. Referring back to FIG. 9, pixels in column 1 are assigned with A+(together with OFF) and pixels in neighboring column 2 are assigned with A− (together with OFF). It is possible the pixels in column 2 also have contribution to state A+. However, assigning the whole column 2 to state A− introduces mapping defects to the system.

Figure 12:
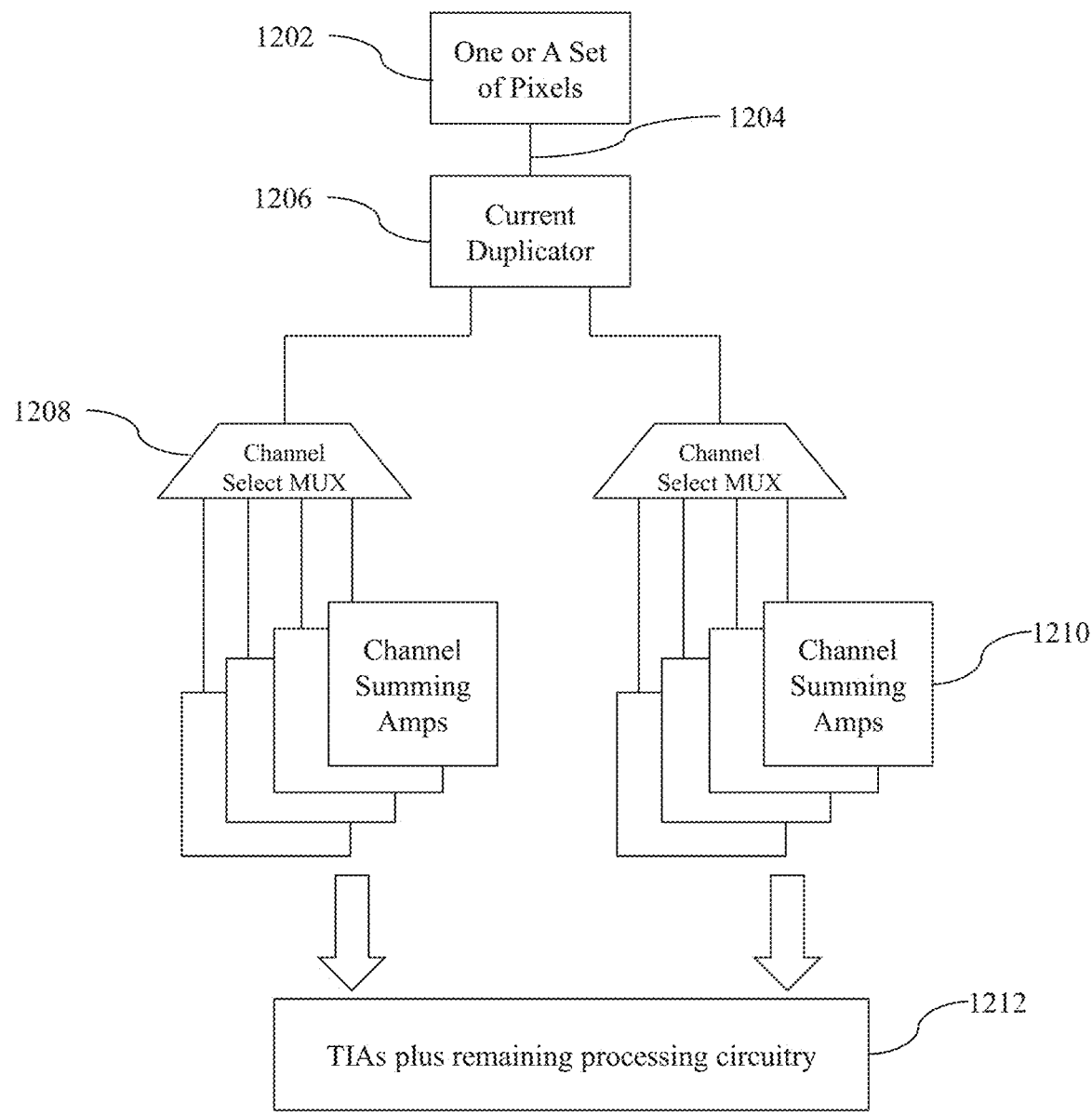
FIG. 12 shows an exemplary schematic of a current duplicating mechanism to assign one or a set of pixels in a configurable photodetector array to more than a single state, in accordance with some embodiments.

FIG. 12 shows an illustration of how the current 1204 from one pixel or a set of pixels 1202 (e.g., a column or part of a column) could be routed to one or more states. This method enables pixels to contribute to different effective shapes thus potentially providing a better match to the code disk slits. A current duplicator 1206 is inserted between the MUXs 1208 and the pixels 1202. In an embodiment, the current duplicator 1206 includes a current mirror to create a copy of the current outputs received, and feeds the copied current outputs to more than one MUX (e.g., two MUXs). The MUXs 1208 are set to route the received current output to different states, such as one for A+ and another for A−, which are collected by respective channel summing amplifiers 1210. Thus, one pixel or a set of pixels can contribute to more than one state. In an alternative embodiment, the two MUXs 1208 in FIG. 12 are set to route the received current outputs to the same state. For example, both MUXs 1208 are set to route the received current outputs to the lumped current-mode outputs A− and collected by the same channel summing amplifier corresponding to A− assignment. This is considered to have doubled the original current outputs from the individual pixel or a set of pixels, equivalently a current weighting function of a weighting factor of 2. The remaining functions for TIAs and processing circuitry 1212 remain the same and are omitted hereby for simplicity.

For a pixel array similar to the one in FIG. 5, in which each pixel may be individually assigned one of the quadrature states, each pixel may have a respective current duplicator. In other words, the number of the current duplicator may be equal to the total pixels in the pixel array. Alternatively, for the sake of simplifying circuits, in some embodiments only pixels at an edge of a slit may have a respective current duplicator. In other words, the number of the current duplicators is much less than the total pixels in the pixel array. For a pixel array similar to the one in FIG. 9, in which pixels in the same column is assigned the same one of the quadrature states, each column may have a respective current duplicator. In other words, the number of the current duplicators may be equal to the number of columns in the pixel array. Alternatively, for the sake of simplifying circuits, perhaps only columns at an edge of a slit may have a respective current duplicator in some embodiments. In other words, the number of the current duplicator may be less than the number of columns in the pixel array in some examples.

Figure 13:
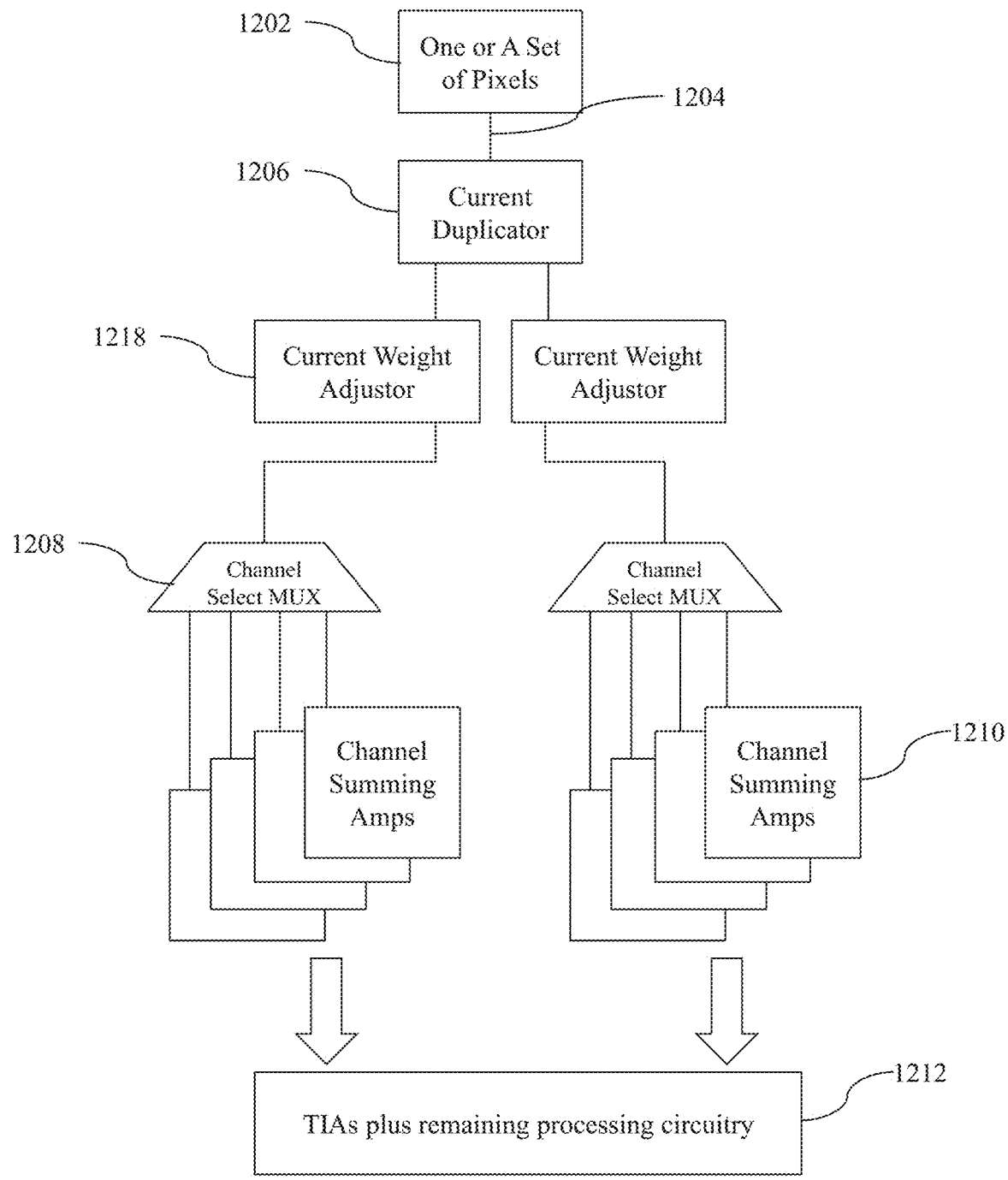
FIG. 13 shows an exemplary schematic of a current duplicating mechanism and a current weight adjusting mechanism to assign one or a set of pixels in a configurable photodetector array to more than a single state with adjusted weights, in accordance with some embodiments.

FIG. 13 shows a further improvement to the current duplicating mechanism illustrated in FIG. 12. Particularly, a current weight adjustor 1218 is added to each output port of the current duplicator 1206, adjusting weights of the copied current outputs before feeding to the MUXs 1208. Similar to the function of a current duplicator, the weighting function allows a similar benefit of providing a more optimal shape to a proximity of the slit. In both cases, there are benefits beyond pure geometric mapping of pixels. It is generally preferred that the output from the quadrature tracks would produce sinusoidal signals, as close as possible to 90 degrees phase-shifted from each other. Depending on the geometry of the code disk slit and the matching pixel assignments, distortion from an ideal sine wave could occur. In a more extreme case where the slits are quite wide, the pattern produced from transposing the code disk over a set of pixels may produce a trapezoid with relative sharp edges at the transition points. This is generally not desirable for the downstream signal processing like interpolators. Being able to weight pixels differently through these techniques enables pixels to be summed in patterns that can produce a more optimal sine wave.

Figure 14:
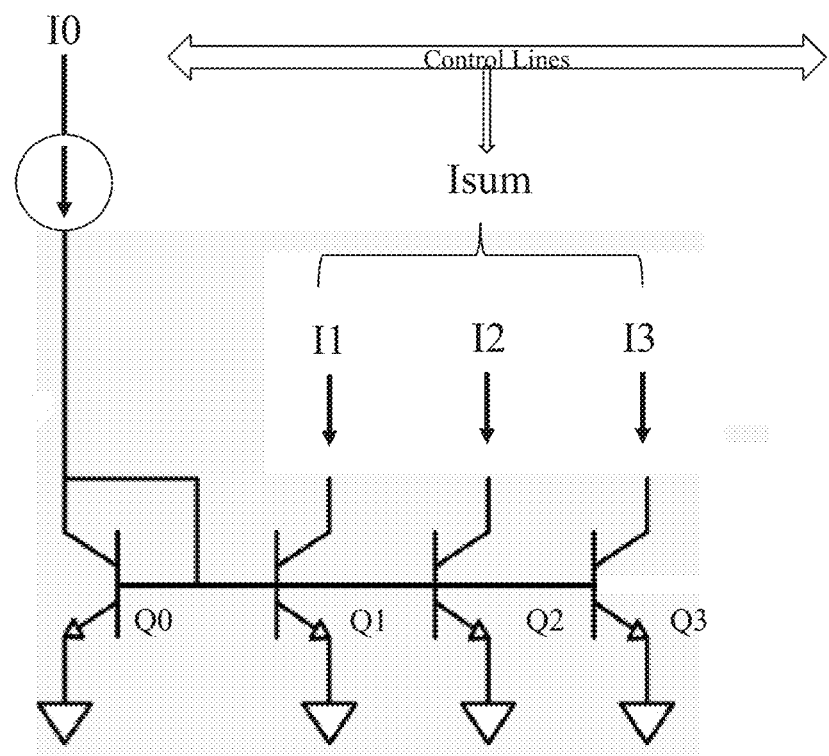
FIG. 14 shows an exemplary circuit diagram of a current weight adjustor, in accordance with an embodiment.

FIG. 14 shows an exemplary circuit diagram of a current weight adjuster. Transistors Q0, Q1, Q2, and Q3 form a current mirror with three output branches, in which current outputs of Q1-Q3 (i.e., I1-I3) track the current input of Q0 (i.e., I0). Since voltages across gate and source of these four transistors are the same, a current flowing through each transistor is approximately proportional to a junction size of the respective transistor. In one embodiment, ratio of the junction sizes of Q0:Q1:Q2:Q3 is about 1:0.6:0.4:0.2. Thus, ratio of the currents of I0:I1:I2:I3 is also approximately 1:0.6:0.4:0.2. The output of the current weight adjuster Isum is operable to take individual or a sum of the mirrored currents I1, I2, and I3, for example, configured by controlling bits from the control line. Therefore, if the weight of I0 is consider as 1, the weight of the output of the current weight adjuster can be selected from a set of {0.2, 0.4, 0.6, 0.8, 1, 1.2}. A current mirror with more output branches (e.g., by adding more transistors mirrored to Q0) may achieve a finer weight adjusting resolution and/or a larger weight adjusting range.

Referring back to FIG. 13, the current weight adjustors coupled to the same current duplicator may have the same or different weight settings. For example, for a column that contributes 40% to state A+ and 60% to state A−, the current duplicator copies the summed current outputs from the column equally, while one current weight adjustor is set to a weight of 0.4 and routes one copied current output through a MUX to group into state A+ and another current weight adjustor is set to a weight of 0.6 and routes another copied current output through another MUX to group into state A−.

Figure 15:
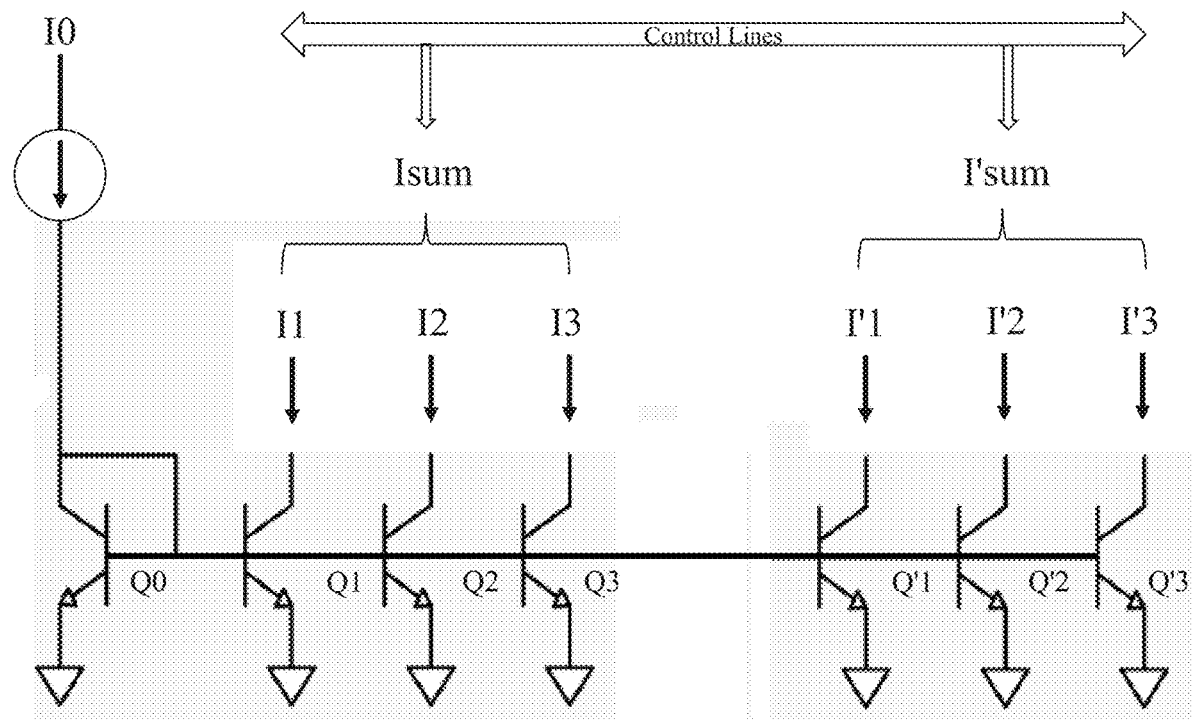
FIG. 15 shows an exemplary circuit diagram of a current duplicator with a current weight adjusting function, in accordance with an embodiment.

The current duplicator and the current weight adjustors may belong to separate circuit blocks. Alternatively, the current duplicator may include a current weight adjusting function in its circuitry. FIG. 15 shows an exemplary circuit diagram of a current duplicator with a current weight adjusting function. The circuit receives one current input I0 and duplicates two weighted current outputs Isum and I'sum. Similar to the current mirror in FIG. 14, the circuit illustrated in FIG. 15 is regarded of having two sets of current mirrors. The first current mirror includes transistors Q0, Q1, Q2, and Q3. The second current mirror includes transistors Q0, Q'1, Q'2, and Q'3. Each of the current outputs Isum and I'sum may be individually set to one or a sum of respective mirrored current branches. In one embodiment, ratios of the junction sizes of Q0:Q1:Q2:Q3 and Q0:Q'1:Q'2:Q'3 are both about 1:0.6:0.4:0.2. Thus, ratios of the currents of I0:I1:I2:I3 and I0:I'1:I'2:I'3 are also approximately 1:0.6:0.4:0.2. Accordingly, each of the current outputs Isum and I'sum has a weight adjusting range in a set of {0.2, 0.4, 0.6, 0.8, 1, 1.2}. For example, by setting Isum=I1+I2 and I'sum=I'1+I'2, the circuit functions as a current duplicator without weight adjusting (or weight=1). Or, by setting Isum=I2 and I'sum=I'1, the circuit functions a current duplicator with a weight setting of 0.4 for one output and a weight setting of 0.6 for another output.

Figure 16:
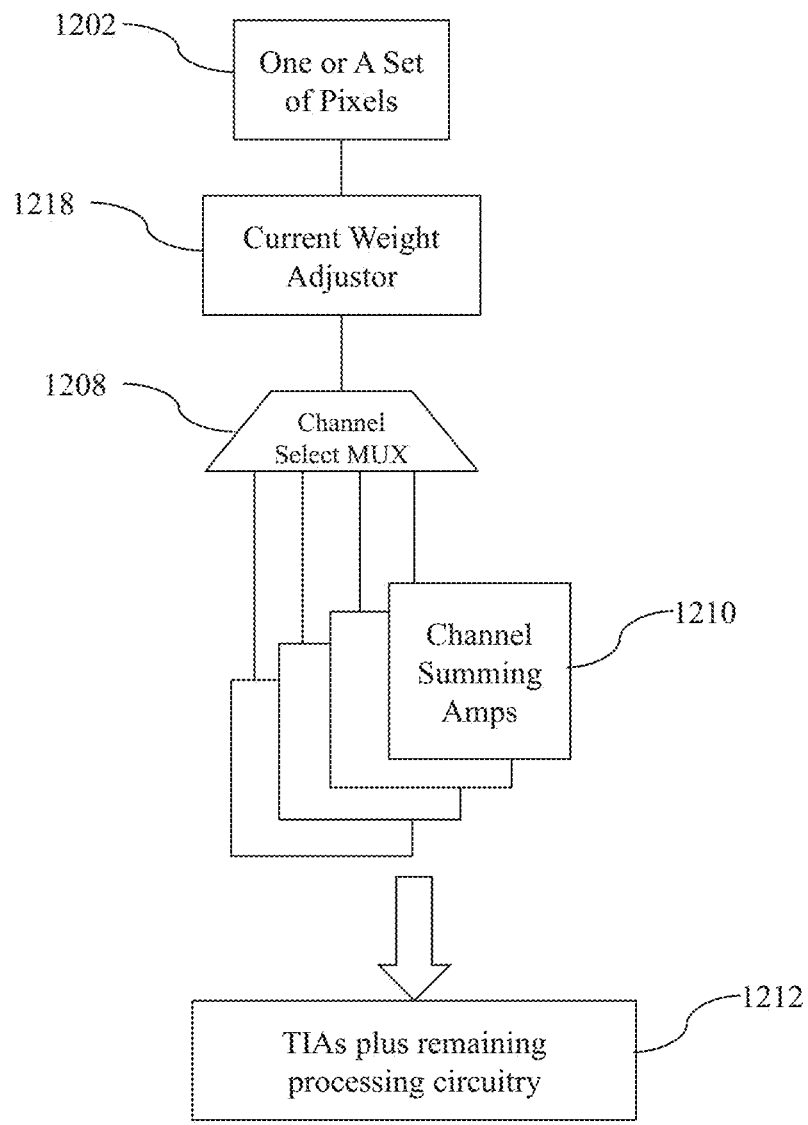
FIG. 16 shows an exemplary schematic of a current weight adjusting mechanism to adjusted weights of a single or a set of pixels in a configurable photodetector array, in accordance with some embodiments.

Either current duplicator or current weight adjustor is optional for the pixel array. In some embodiments, the pixel array may have current weight adjustors 1218 but no current duplicator, such as the one illustrated in FIG. 16. FIG. 16 shows an illustration of applying a weighting function to one pixel, or a set of pixels 1202 (e.g., a column or part of a column), allowing a similar benefit as discussed above for providing a more optimal shape to the proximity of the slit. In one embodiment, weights for each pixel in the pixel array can be adjusted. In yet another embodiment, weights for each column in the pixel array can be adjusted. The remaining functions for MUX 1208, channel summing amplifiers 1210, TIAs and processing circuitry 1212 remain the same and are omitted hereby for simplicity.

Figure 17:
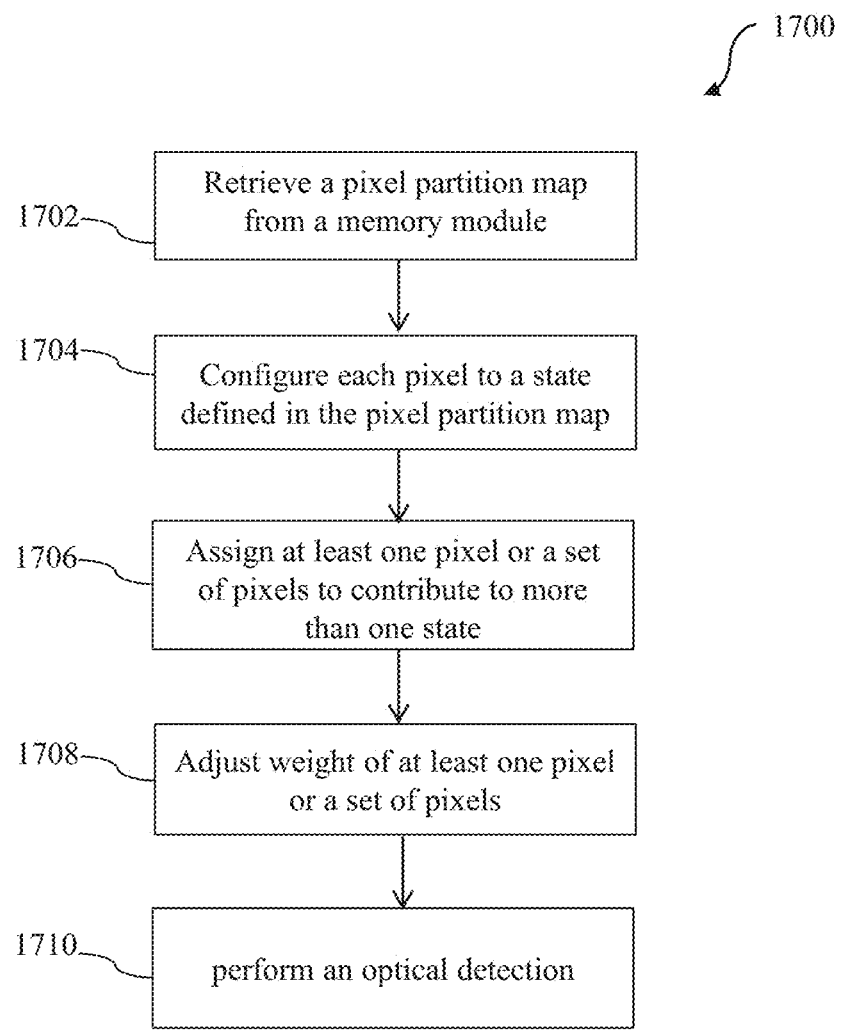
FIG. 17 shows a flowchart of an exemplary method of assigning current duplication and current weight adjustment to a configurable photodetector array, in accordance with some embodiments.

FIG. 17 shows a flow chart of an exemplary method 1700 of operating an optical encoder with a pixel array. A controller, such as a physically separate computer system (e.g., a PC) and/or other microcontroller unit(s) (e.g., an ASIC) may execute the operations of method 1700 by reading code from a computer-readable medium and executing the code to provide the functionality discussed herein. At operation 1702, the optical sensor IC retrieves a pixel partition map from a memory module after a power up. In an embodiment, the optical sensor IC may run an internal state machine that reads an external non-volatile memory to load the pixel partition map. At operation 1704, each pixel in the pixel array is configured to a state defined in the pixel partition map, for example the map defines each individual pixel into one of the four quadrature regions discussed above or an OFF state. For example, control signals may be applied to switches (e.g., MUXs) to couple each pixel with a respective current line. At operation 1706, at least one pixel or a set of pixels (e.g., a column or part of a column) is assigned to more than one state. In some embodiments, a current duplicator copies a current output from the respective one pixel or a set of pixels to two or more MUXs. The two or more MUXs subsequently route the copied current outputs to respective channel summing amplifiers with different states. Operationally, the method 1700 includes an operation 1708, which adjusts weights of outputs from the current duplicator. Alternatively, operation 1706 may be optional and skipped, while operation 1708 directly adjusts weights of current outputs from at least one pixel or a set of pixels.

Which pixels or columns may be affected in operations 1706 and 1708 may be determined by the system recording misalignment results, such as a joint consideration of phase differences between adjacent quadrature current waveforms and current magnitude balance. For instance, simulation or experimentation may be used to iteratively measure phase differences and then make adjustments to reach 90° phase differences. At operation 1710, the optical encoder performs an optical detection, by collecting currents from different assigned regions on the pixel array in response to a light emitter that is modulated by a moving object, such as code slits rotating around a linear axis or sliding up/down a linear strip.

Using a pixel array with current weighting functions in an encoder system also allows an alignment adjustment process to first map a light intensity profile from the light source and then use the result to fine tune a partition map during the regular operation. In the ideal case, the light source (e.g., a LED) in the encoder system would provide a uniform light intensity for the diameter of the light source. In actual designs, the light source often exhibits a non-uniform light intensity distribution with rolloff on the side and a non-flat top of the light source. In some embodiments, the light intensity profile fits a Gaussian distribution. The adjustment process may first map light intensity by programming blocks of pixels and measuring the corresponding current output to obtain an intensity profile map. This map may help to determine pixels and respective current weights to be adjusted to mitigate non-uniform distribution in the illumination. This weight adjustment would then be overlaid on the pixel pattern during regular operation to change weights of one or more pixels to provide a uniform signal intensity for each of the quadrature channels. For example, an LED may have a higher output stripe near one quad grouping, such that one quadrature region could be gained down compared with other quadrature regions by selecting fewer pixels by setting one or more pixels to OFF state, or by using an analog technique such as assigning a weight (e.g., <1 for less gain or >1 for higher gain) to currents generated by one or more pixels in the corresponding quadrature region. In a particular example, a peripheral region of the pixel array receives less light intensity than a center region, while the weight adjustment increases the current outputs from the pixels in the peripheral region and/or decreasing the current outputs from the pixels in the center region to compensate the light source non-uniformity.

Figure 18:
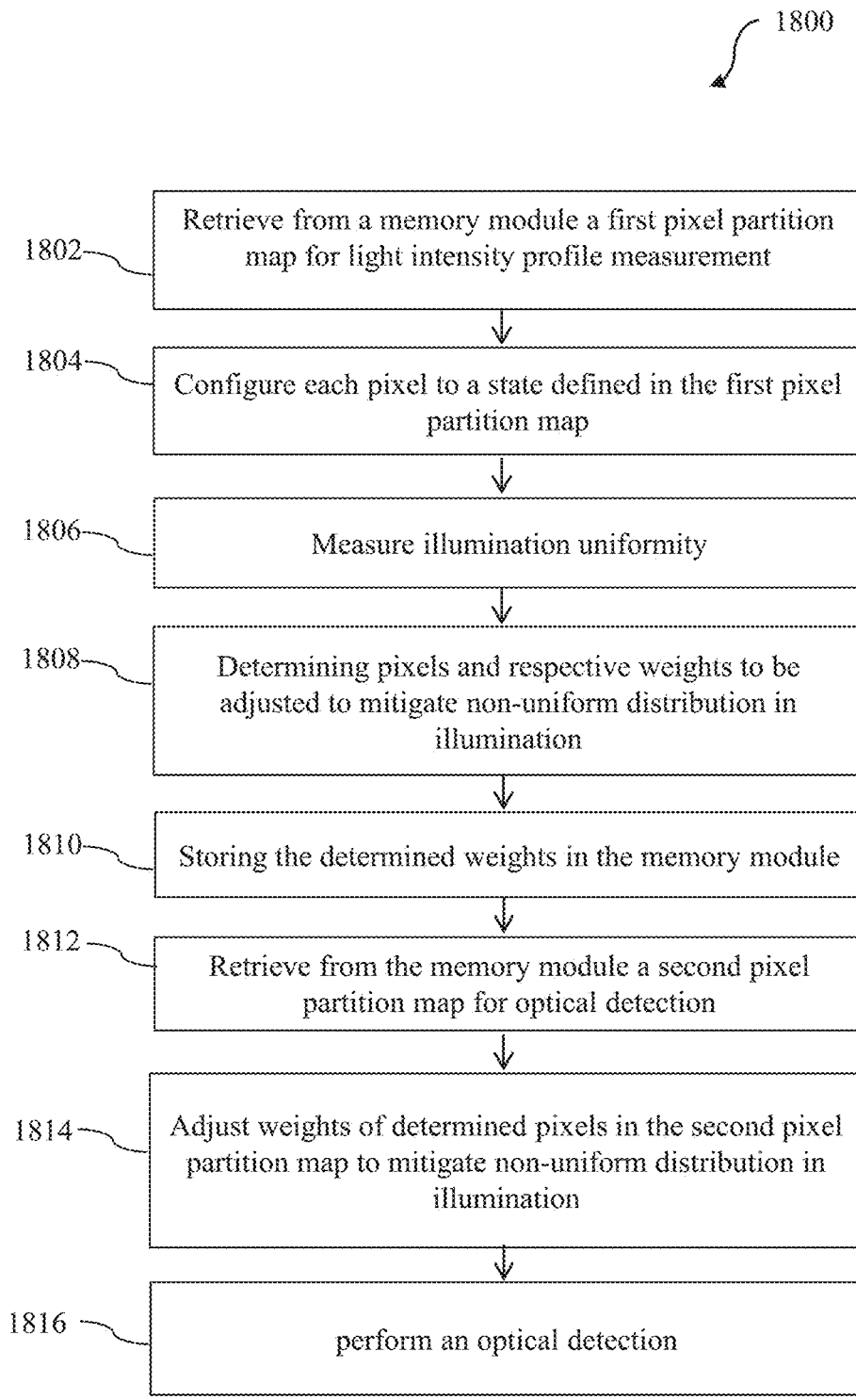
FIG. 18 shows a flowchart of an exemplary method of adjusting current weights of a configurable photodetector array to mitigate light intensity non-uniformity in an encoder system, in accordance with some embodiments.

FIG. 18 shows a flow chart of an exemplary method 1800 that combines the light intensity non-uniformity compensation and normal (or mission mode) operation. Multiple operations in the method 1800 may be similar to those in method 1700, which will be described briefly for simplicity. A controller, such as a physically separate computer system (e.g., a PC) and/or other microcontroller unit(s) may execute the operations of method 1800 by reading code from a computer-readable medium and executing the code to provide the functionality discussed herein.

At operation 1802, the optical encoder retrieves a first pixel partition map from a memory module after a power up. In some embodiments, the first pixel partition map is specifically designed to benchmark the illumination profile and is different from the one used later on at operation 1812 for normal operation purpose. In some embodiments, the first pixel partition map is the same with the one used later on at operation 1812 for normal operation purpose. In an embodiment, the optical sensor IC may run an internal state machine that reads an external non-volatile memory to load the map. At operation 1804, each pixel in the pixel array is configured to a state defined in the first pixel partition map, for example the map defines each individual pixel into one of the four quadrature regions discussed above or an OFF state. For example, control signals may be applied to switches (e.g., MUXs) to couple each pixel with a respective current line. At operation 1806, the light intensity profile from the light source is measured by the pixel array. At operation 1808, based on the measured light intensity profiled, one or more pixels are determined to be adjusted to mitigate non-uniform distribution in the illumination. The adjustment may include changing weights assigned to the currents corresponding to the selected pixels, such as setting the selected pixels to reduce gain or to increase gain with a purpose of creating four sine waves of equal amplitude separated by 90°. At operation 1810, the determined weights are stored in the memory module.

At operation 1812, the optical encoder retrieves a second pixel partition map from the memory module. The second pixel partition map corresponds to the quadrature tracks on a code wheel and will be used for normal operation. At operation 1814, the current weights of pixels selected at operation 1808 is adjusted, such as by retrieving the determined weights from the memory module and overlaying the weights on the second pixel partition map. As discussed above, the adjustment may include setting the selected pixels to reduce current output (or set to OFF) or to increase current output. Subsequently, at operation 1816, the optical encoder performs an optical detection, by collecting currents from different assigned regions on the pixel array in response to a light emitter that is modulated by a moving object, such as code slits rotating around a linear axis or sliding up/down a linear strip.

The optical encoder in the present disclosure may be adapted for use in both transmissive and reflective architectures. The description here is for a transmissive design where the LED is on one side of the code wheel and the detector is on the other. In a reflective design, the LED sits on the same side with the detector IC, either on-chip or off-chip with the detector IC, and reflects light off the code wheel with reflective "slits" and non-reflective spaces. This may provide a smaller system design. The pixel array supports both transmissive and reflective architectures. In an exemplary reflective design, the LED is on the same die with the detector IC. In another exemplary reflective design, the LED and the detector IC are on two separate devices (e.g., two dies) but physically assembled together.

The concepts discussed herein can be applied to linear encoders as well as rotary encoders. In a linear design, the equivalent of code slits would be on a linear axis and slide up/down the pixel array. The pixel array would work equally well in that scenario. For example, in a linear encoder embodiment the motion object may include pulses-per-length, as opposed to a rotary encoder that uses radius and PPR.

The pixels may be constructed with configurations accessed either from a random-access memory (RAM) or from a non-volatile memory (NVM). In the case of RAM, a host microcontroller may set each memory. Alternatively, the encoder ASIC may contain logic to read from an external NVM or an internal NVM and set the memory that way. Internal NVM may be programmable—i.e., flash, or may be a one-time-programmable memory. The pixels may also be set using a read-only memory (ROM) to store static pattern although that reduces the advantage of user flexibility. Users with sufficient volume may order a ROM pattern to eliminate the need to configure the memory at run time.

In various embodiments, the pixel array may have configurable pixels that may be set by a memory to map to one of the four channels. The configurable pixels may be set either by a host microcontroller, using an internal non-volatile memory with a circuit to read and set, or by using a masked ROM where the pixels are set in some factory alignment configuration. However, various embodiments may use any appropriate processor or memory. Furthermore, in-system configurability is possible for some embodiments. Encoder manufacturers may apply a patch in the field, updating the pixel map after the product has been installed in the field. This patch may improve or otherwise change performance characteristics.

Also, the lack of a visible phased-array pattern makes the design less susceptible to cloning. Traditionally, a regular phased-array can be observed under a microscope to determine size of features thus allowing a competitor to copy the design. The pixel array does not have any indication of mapping thus requiring the I²C or other protocol stream to be interrupted in order to determine which pixels are mapped to which quadrature region. This would be considerably more difficult to copy.

Moreover, the configurable pixel arrays may also allow a user to use same IC to develop a product portfolio of difference performance levels, for example by setting different thresholds to limit an optical encoder's precision level. Therefore, encoder manufacturers may provide different performance/price points with a common set of hardware including code wheel. Remapping the pixel array with a common code wheel may allow different performance of the resulting system. Encoder manufacturers may offer higher or lower price points based on performance with identical hardware thus allowing them to market their products differently.

The principle of the present disclosure may also be applicable to a magnetic encoder as to an optical encoder. For example, in a magnetic encoder, instead of a configurable photodetector array including a plurality of photodetectors, the system may have a configurable magnetic-field detector array including a plurality of magnetic detectors. A magnetized part in the emitter generates a magnetic flux. The configurable magnetic-field detector detects changes of the magnetic flux modulated by the moving object, such as a code wheel or a code stripe. The other aspects of the magnetic encoder are similar to what have been described above in the optical encoder and omitted here for the sake of simplicity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An encoder system, comprising:
a configurable detector array including a plurality of detectors;
a memory configured to store a partition map, wherein the partition map defines a state for each of the detectors;
a controller operable to read from the memory the partition map and to configure the configurable detector array according to the partition map;
an emitter operable to generate a flux modulated by a motion object, wherein the detectors are operable to generate currents in response to the flux;
a first means for assigning weights to the currents; and
a second means for grouping the currents generated by the detectors having a same state.

2. The encoder system of claim 1, further comprising:
a third means for duplicating at least a portion of the currents.

3. The encoder system of claim 1, wherein the first means assigns the weights according to a density distribution of the flux.

4. The encoder system of claim 1, wherein the second means groups the currents generated by the detectors from a same column of the configurable detector array.

5. The encoder system of claim 1, wherein the second means includes a plurality of multiplexers configured to route the currents according to respective states of each of the detectors.

6. The encoder system of claim 1, wherein:
the plurality of detectors comprises a plurality of photodetectors;
the emitter comprises a light emitter; and
the flux comprises a light flux.

7. The encoder system of claim 1, wherein:
the plurality of detectors comprises a plurality of magnetic detectors;
the emitter includes a magnetized part; and
the flux comprises a magnetic flux.

8. A method of adjusting an optical encoder system, comprising:
retrieving a partition map from a memory;
configuring a photodetector array based on the partition map, the photodetector array comprising a plurality of photodetectors, wherein each photodetector in the photodetector array is assigned a quadrature state by the partition map;
performing a light intensity detection by the photodetector array; and
adjusting weights of current outputs from the plurality of photodetectors to mitigate a light intensity non-uniformity identified by the light intensity detection.

9. The method of claim 8, wherein adjusting the weights includes increasing the current outputs from the photodetectors in a peripheral region of the photodetector array relative to current outputs from the photodetectors in a central region of the photodetector array.

10. The method of claim 8, wherein adjusting the weights includes decreasing the current outputs from the photodetectors in a center region of the photodetector array relative to current outputs from the photodetectors in a peripheral region of the photodetector array.

11. The method of claim 8, further comprising:
storing settings of the adjusted weights in the memory.

* * * * *